US011057997B2

(12) United States Patent
Yasuda

(10) Patent No.: US 11,057,997 B2
(45) Date of Patent: Jul. 6, 2021

(54) HIGH-FREQUENCY MODULE

(71) Applicant: Murata Manufacturing Co., Ltd., Kyoto (JP)

(72) Inventor: Tomomi Yasuda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 83 days.

(21) Appl. No.: 16/451,615

(22) Filed: Jun. 25, 2019

(65) Prior Publication Data
US 2019/0320531 A1 Oct. 17, 2019

Related U.S. Application Data

(63) Continuation of application No. PCT/JP2017/045404, filed on Dec. 18, 2017.

(30) Foreign Application Priority Data

Dec. 27, 2016 (JP) ............................. JP2016-254507

(51) Int. Cl.
*H05K 7/00* (2006.01)
*H05K 1/11* (2006.01)
(Continued)

(52) U.S. Cl.
CPC .............. *H05K 1/119* (2013.01); *H01L 23/13* (2013.01); *H01L 23/49838* (2013.01);
(Continued)

(58) Field of Classification Search
CPC ................... H05K 1/119; H05K 1/181; H05K 2201/1003; H05K 2201/1006;
(Continued)

(56) References Cited

U.S. PATENT DOCUMENTS 7,166,917 B2 1/2007 Yang et al.
2005/0104685 A1* 5/2005 Kuroki ................... H03H 9/725
333/133
(Continued)

FOREIGN PATENT DOCUMENTS

JP 01183192 * 7/1989
JP H01-183192 A 7/1989
(Continued)

OTHER PUBLICATIONS

International Search Report for International Application No. PCT/JP2017/045404, dated Feb. 27, 2018.
(Continued)

*Primary Examiner* — Yuriy Semenenko
(74) *Attorney, Agent, or Firm* — Pearne & Gordon LLP

(57) ABSTRACT

A high-frequency module (1) includes a substrate (10), a first electronic component (30) and a second electronic component (40) mounted on a main surface (10a) of the substrate (10). The substrate (10) has a protruding portion (20) projecting from the main surface (10a), the first electronic component (30) is mounted in a region of the main surface (10a) different from a region in which the protruding portion (20) is provided, and the second electronic component (40) is mounted on the protruding portion (20).

16 Claims, 8 Drawing Sheets

(51) Int. Cl.
*H01L 23/13* (2006.01)
*H01L 23/498* (2006.01)
*H01L 23/00* (2006.01)
*H01L 25/18* (2006.01)
*H05K 1/18* (2006.01)

(52) U.S. Cl.
CPC .............. *H01L 24/16* (2013.01); *H01L 24/17* (2013.01); *H01L 25/18* (2013.01); *H05K 1/181* (2013.01); *H01L 2224/16235* (2013.01); *H01L 2224/16238* (2013.01); *H01L 2224/17135* (2013.01); *H05K 2201/1003* (2013.01); *H05K 2201/1006* (2013.01); *H05K 2201/10545* (2013.01)

(58) Field of Classification Search
CPC .......... H05K 2201/10545; H05K 2201/10674; H05K 3/284; H05K 1/113; H05K 2201/0367; H05K 2201/09045; H05K 3/4629; H05K 2201/10083; H01L 23/13; H01L 23/49838; H01L 24/16; H01L 24/17; H01L 25/18; H01L 2224/16235; H01L 2224/16238; H01L 2224/17135; H01L 23/66; H01L 25/16; H01L 24/13; H01L 2924/3025; H01L 2924/15159; H01L 2224/0401; H01L 2224/131; H01L 2924/15313; H01L 2924/19042; H01L 2924/19105; H01L 23/5383; H01L 23/5384; H01L 23/5386; Y02P 70/50
See application file for complete search history.

(56) References Cited

U.S. PATENT DOCUMENTS

| | | |
|---|---|---|
| 2015/0131231 A1 | 5/2015 | Yoo et al. |
| 2015/0334841 A1 | 11/2015 | Schmid |

FOREIGN PATENT DOCUMENTS

| | | | |
|---|---|---|---|
| JP | 2000-340921 A | | 12/2000 |
| JP | 2000340921 | * | 12/2000 |
| JP | 2005-123909 A | | 5/2005 |
| JP | 2007-312108 A | | 11/2007 |

OTHER PUBLICATIONS

Written Opinion for International Application No. PCT/JP2017/045404, dated Feb. 27, 2018.

* cited by examiner

HIGH-FREQUENCY MODULE

This is a continuation of International Application No. PCT/JP2017/045404 filed on Dec. 18, 2017 which claims priority from Japanese Patent Application No. 2016-254507 filed on Dec. 27, 2016. The contents of these applications are incorporated herein by reference in their entireties.

BACKGROUND OF THE DISCLOSURE

Field of the Disclosure

The present disclosure relates to a high-frequency module in which a plurality of electronic components is mounted on a substrate.

Description of the Related Art

Conventionally, a high-frequency module in which a plurality of electronic components is mounted on a substrate has been known. The high-frequency module is used, for example, as a component constituting a mobile communication device.

As an example of such a high-frequency module, Patent Document 1 describes a high-frequency module including a substrate, and an acoustic wave filter and a power amplifier circuit element mounted on the substrate. In this high-frequency module, the acoustic wave filter and the power amplifier circuit element are mounted so as to be adjacent to each other on the same plane of the substrate.

Patent Document 1: Japanese Unexamined Patent Application Publication No. 2005-123909

BRIEF SUMMARY OF THE DISCLOSURE

Along with miniaturization and multiband of mobile communication devices in recent years, miniaturization and high integration of high-frequency modules have been demanded. However, as in the high-frequency module described in Patent Document 1, when the acoustic wave filter and the power amplifier circuit element are mounted in the state of being adjacent to each other on the same plane of the substrate, there is a problem that the isolation between the acoustic wave filter and the power amplifier circuit element is reduced.

The present disclosure is made to solve the above problem, and an object of the present disclosure is to improve the isolation of a plurality of electronic components mounted on a substrate in a high-frequency module.

In order to achieve the above object, a high-frequency module according to an aspect of the present disclosure includes a substrate, a first electronic component and a second electronic component mounted on a main surface of the substrate, in which the substrate includes a protruding portion projecting from the main surface, the first electronic component is mounted on a region of the main surface different from a region in which the protruding portion is provided, and the second electronic component is mounted on the protruding portion.

In this manner, by disposing the first electronic component on the main surface of the region different from the region in which the protruding portion is provided, and disposing the second electronic component on the protruding portion, the first electronic component and the second electronic component can be separated from each other in a height direction. Accordingly, the signal interference between the first electronic component and the second electronic component can be reduced, and the isolation can be improved.

Also, the first electronic component may be connected to the substrate by a first bonding member, and a height of the protruding portion may be higher than a height of the first bonding member.

In this manner, by making the height of the protruding portion higher than that of the first bonding member, the second electronic component can be disposed away from the first electronic component by a dimension corresponding to a difference between the heights. Accordingly, the signal interference between the first electronic component and the second electronic component can be reduced, and the isolation can be improved.

Further, the protrusion portion may include a plurality of columnar electrodes, and a ceramic portion covering side surfaces of the respective columnar electrodes, and the second electronic component may be connected to an end surface of each of the columnar electrodes by a second bonding member.

In this manner, by covering the side surfaces of the respective columnar electrodes by the ceramic portion, the signal interference between the first electronic component and the second electronic component connected to the columnar electrodes can be reduced.

In addition, the protruding portion may have a rectangular outer shape when the substrate is viewed from a thickness direction, and may project in the thickness direction farther than a substrate outer peripheral portion positioned outside of the region in which the protruding portion is provided.

In this manner, the protruding portion projects from the substrate outer peripheral portion, so that a height of the substrate outer peripheral portion is made lower than that of the protruding portion. Thus, even when an electronic component having a large height is disposed on the substrate outer peripheral portion, the high-frequency module can be reduced in height.

Further, the protruding portion of the high-frequency module may be configured with a plurality of columnar electrodes, and the second electronic component may be connected to an end surface of each of the columnar electrodes by a second bonding member.

By configuring the protruding portion with the plurality of columnar electrodes in this manner, the first electronic component and the second electronic component can be separated from each other in the height direction. Accordingly, the signal interference between the first electronic component and the second electronic component can be reduced, and the isolation can be improved.

Further, each of the plurality of columnar electrodes may be provided around the first electronic component, and the second electronic component may be disposed at a position higher than that of the first electronic component so as to cover the first electronic component.

According to this structure, the high-frequency module can be miniaturized.

Also, the plurality of columnar electrodes may include a columnar electrode for signal input/output connected to a signal terminal of the second electronic component, and a columnar electrode for grounding connected to a ground terminal of the second electronic component, and when viewed from a thickness direction with respect to the substrate, an interval between the columnar electrode for grounding and a signal terminal of the first electronic component may be smaller than an interval between the columnar electrode for signal input/output and the signal terminal of the first electronic component.

In this manner, by disposing the columnar electrode for grounding near the signal terminal of the first electronic component, and disposing the columnar electrode for signal input/output away from the signal terminal of the first electronic component, the columnar electrode for grounding can be made to act as a shield for the signal terminal. Accordingly, the signal interference between the first electronic component and the second electronic component can be suppressed, and the isolation of the first electronic component and the second electronic component can be improved.

Further, each of the columnar electrodes may contain a copper material.

In this manner, the columnar electrode contains the copper material, so that electric resistance of the columnar electrode can be reduced. Further, the columnar electrodes can be easily formed.

Further, the first electronic component may be an acoustic wave device, and the second electronic component may be a semiconductor circuit device.

In this manner, even when the first electronic component is an acoustic wave device, and the second electronic component is a semiconductor circuit device, by disposing the first electronic component and the second electronic component so as to be separated from each other in the height direction, the isolation of the first electronic component and the second electronic component can be improved.

Further, the high-frequency module may further include a chip inductor mounted on the substrate, and the chip inductor may be disposed so as to be adjacent to the protruding portion in a region of the main surface different from a region in which the protruding portion and the first electronic component are provided.

In this manner, even when the high-frequency module includes the chip inductor, by providing the chip inductor so as to be adjacent to the protruding portion, the high-frequency module can be miniaturized.

Furthermore, the high-frequency module may further include a third electronic component mounted on another main surface of the substrate opposite to the main surface.

Accordingly, the high-frequency module can be highly integrated.

According to a high-frequency module of the present disclosure, the isolation of a plurality of electronic components mounted on a substrate can be improved.

DETAILED DESCRIPTION OF THE DISCLOSURE

Figure 1:
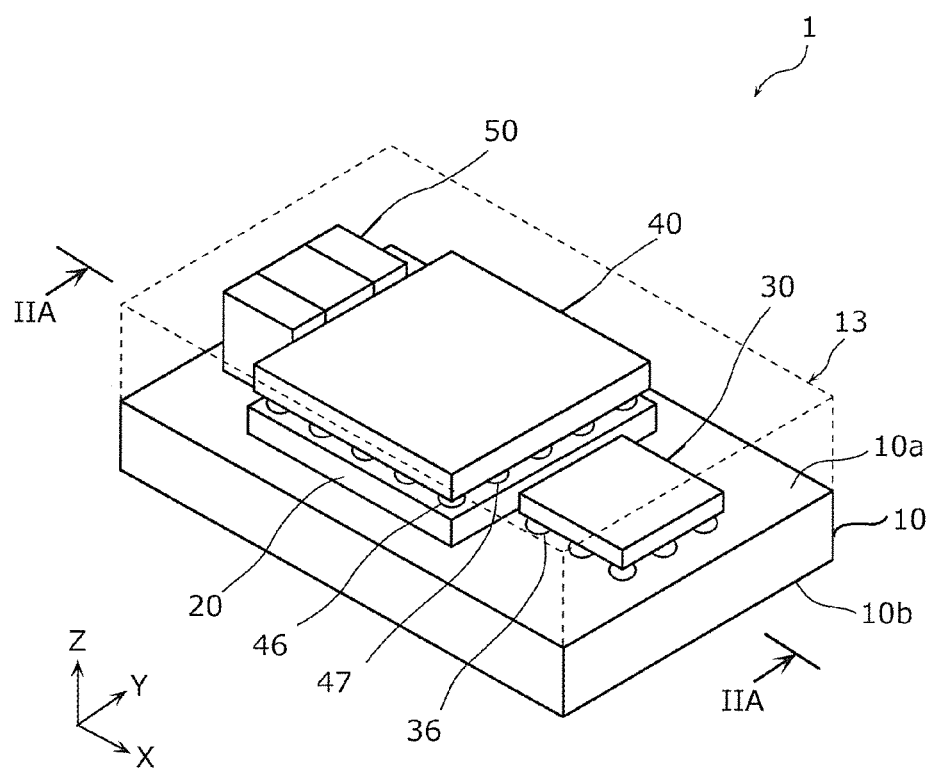
FIG. 1 is a perspective view schematically illustrating a high-frequency module according to Embodiment 1.

Hereinafter, the high-frequency modules according to embodiments of the present disclosure will be described with reference to the accompanying drawings. Note that, any of embodiments described below illustrate a preferred embodiment of the present disclosure. Numerical values, shapes, materials, constituent elements, arrangement positions and connection forms of the constituent elements, manufacturing processes and order of the manufacturing processes, and the like, illustrated in the following embodiments are merely examples, and are not intended to limit the present disclosure. Further, among the constituent elements in the following embodiments, constituent elements not described in an independent claim illustrating the most significant concept will be described as arbitrary constituent elements. Also, sizes or ratios of sizes of the constituent elements illustrated in the drawings are not necessarily exact. Further, in the drawings, the same reference symbols are given to substantially the same configurations, and redundant descriptions thereof will be omitted or simplified.

Embodiment 1

[1-1. Configuration of High-Frequency Module]

First, a configuration of a high-frequency module 1 according to Embodiment 1 will be described.

Figure 2A:
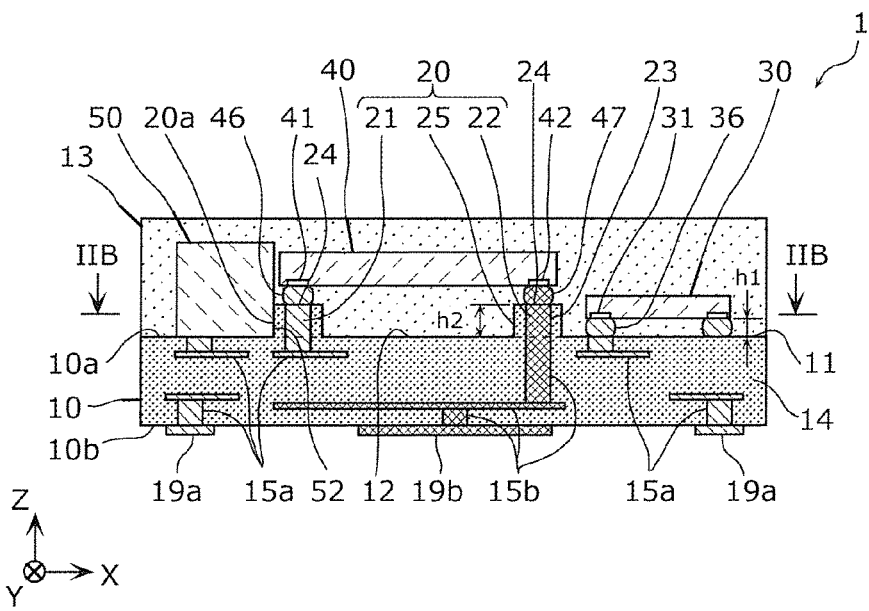
FIG. 2A is a cut front view of the high-frequency module according to Embodiment 1, cut along a line IIA-IIA illustrated in FIG. 1.
Figure 2B:
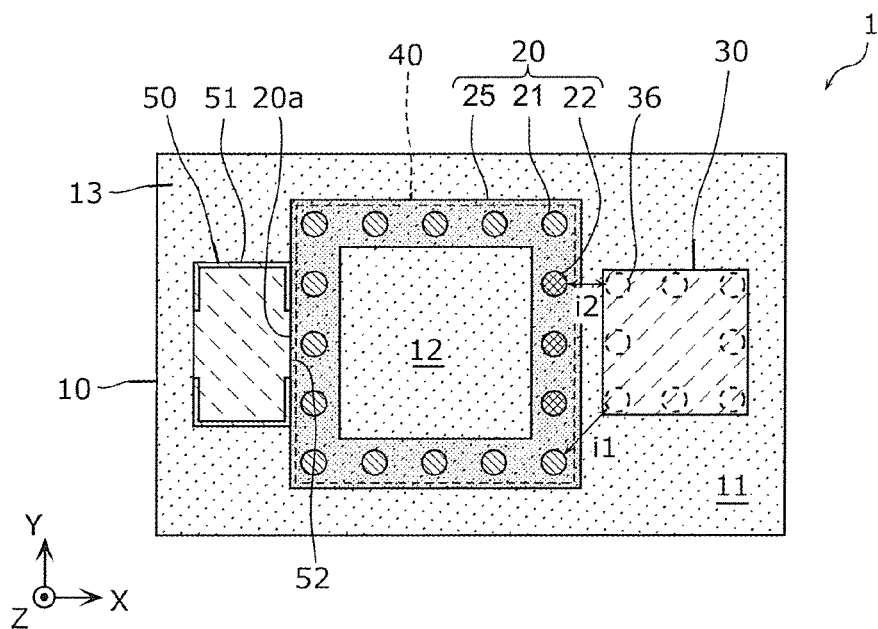
FIG. 2B is a cut plan view of the high-frequency module according to Embodiment 1, cut along a line IIB-IIB illustrated in FIG. 2A.

FIG. 1 is a perspective view schematically illustrating the high-frequency module 1. FIG. 2A is a cut front view of the high-frequency module 1, cut along the line IIA-IIA illustrated in FIG. 1. FIG. 2B is a cut plan view of the high-frequency module 1, cut along the line IIB-IIB illustrated in FIG. 2A.

As illustrated in FIG. 1 and FIG. 2A, the high-frequency module 1 includes a substrate 10, and a first electronic component 30, second electronic component 40, and chip inductor 50 mounted on the substrate 10. In the high-frequency module 1, a sealing portion 13 is provided on the substrate 10, so as to cover the first electronic component 30, the second electronic component 40, and the chip inductor 50.

The first electronic component 30 is an acoustic wave device including an acoustic wave element used in an arbitrary frequency band, for example, in a frequency band of 500 MHz or more and 1500 MHz or less, within a frequency band of 500 MHz or more and 6 GHz or less. The first electronic component 30 has a rectangular parallelepiped shape, and a plurality of signal terminals (hot terminals) 31 drawn out from the input/output wiring of the acoustic wave element is provided on a bottom surface of the first electronic component 30. The first electronic component 30 is connected to the substrate 10 by a plurality of first bonding members 36 corresponding to the respective signal terminals 31. The first bonding member 36 is, for example, a solder bump. A height h1 of the first bonding member 36 is, for example, 40 μm.

Note that, the acoustic wave device may be a surface acoustic wave (SAW) filter or a bulk acoustic wave (BAW) filter. In the case of an SAW filter, a substrate and an interdigital transducer (IDT) electrode are included. The substrate is a substrate having piezoelectricity on at least a surface thereof. For example, the substrate may include a piezoelectric thin film on a surface thereof, and may be formed of a multilayer body including a film having a different acoustic velocity from that of the piezoelectric thin film, a support substrate, or the like. Moreover, the entire substrate may have piezoelectricity. In this case, the substrate is a piezoelectric substrate made of one piezoelectric layer.

The second electronic component 40 is, for example, a semiconductor circuit device including a semiconductor element such as a switching element or an amplifier circuit element. The second electronic component 40 is inputted with and outputs a high-frequency signal in an arbitrary frequency band of, for example, 500 MHz or more and 1500 MHz or less, within a frequency band of 500 MHz or more and 6 GHz or less. The second electronic component 40 has a rectangular parallelepiped shape, and a plurality of signal terminals (hot terminals) 41 drawn out from the input/output wiring of a semiconductor element and a plurality of ground terminals 42 are provided on a bottom surface of the second electronic component 40. The second electronic component 40 is connected to the substrate 10 by a plurality of second bonding members 46 for signal input/output corresponding to the respective signal terminals 41, and a plurality of second bonding members 47 for grounding corresponding to the respective ground terminals 42. Each of the second bonding members 46 and 47 is, for example, a solder bump. A height of the second bonding members 46 and 47 is, for example, 40 μm.

The first electronic component 30 and the second electronic component 40 are mounted in a state of being close to each other in a direction (for example, in an X direction) along one main surface 10a of the substrate 10. Note that, the state of being close refers to, for example, a state in which an interval between the first electronic component 30 and the second electronic component 40 is more than 0 μm and less than or equal to 300 μm.

The chip inductor 50 is a multilayer inductor manufactured by a method including, for example, a sheet lamination method, a printing lamination method, or a thin film formation method. The chip inductor 50 has a rectangular parallelepiped outer shape, and a pair of outer electrodes 51 is formed at both ends or at a bottom surface thereof. The chip inductor 50 is connected to the substrate 10 by a solder material or the like. As the chip inductor 50 according to the present embodiment, an inductor having the high quality coefficient Q and a high outer shape (higher than the respective outer shapes of the first electronic component 30 and the second electronic component 40) is adopted.

The substrate 10 includes a base material portion 14 formed by laminating a plurality of ceramic base materials, and inner conductors 15a and 15b provided inside the substrate 10. The inner conductor 15a is an inner conductor for signal input/output, and the inner conductor 15b is an inner conductor for grounding. Each of the inner conductors 15a and 15b is composed of an in-plane conductor and an interlayer conductor. The inner conductors 15a and 15b are made of, for example, a metal material containing copper as a main component. The substrate 10 includes the one main surface 10a and another main surface 10b positioned opposite to the one main surface 10a. On the other main surface 10b, an outer terminal 19a connected to the inner conductor 15a for signal input/output, and an outer terminal 19b connected to the inner conductor 15b for grounding are formed.

A protruding portion 20 projecting from the main surface 10a is formed on the main surface 10a of the substrate 10. A height h2 of the protruding portion 20 is higher than the height h1 of the first bonding member 36. Specifically, the height of the protruding portion 20 is, for example, 50 μm or more and 200 μm or less. In addition, in the height direction (a Z direction), a position of an upper end of the protruding portion 20 is higher than a position of the bottom surface of the first electronic component 30, and is lower than a position of a top surface of the first electronic component 30. Here, the "height direction" means the same direction as a thickness direction of the substrate 10, and "high" means that a distance from a region (a substrate outer peripheral portion 11, which will be described later) different from a region in the main surface 10a of the substrate 10 in which the protruding portion 20 is provided is large.

The protruding portion 20 includes a plurality of columnar electrodes 21 and 22, and a ceramic portion 25.

The columnar electrodes 21 and 22 have a cylindrical shape with a diameter of 500 μm, for example. However, the columnar electrodes 21 and 22 may have a prismatic shape. A height of the columnar electrodes 21 and 22 is the same as the height h2 of the protruding portion 20. Of both end surfaces of the columnar electrode 21, one end surface 24 exposed to the upper end of the protruding portion 20 is connected to the signal terminal 41 of the second electronic component 40 with the second bonding member 46 interposed therebetween, and an end surface opposite to the one end surface 24 is connected to the inner conductor 15a. Of both end surfaces of the columnar electrode 22, the one end surface 24 exposed to the upper end of the protruding portion 20 is connected to the ground terminal 42 of the second electronic component 40 with the second bonding member 47 interposed therebetween, and the end surface opposite to the one end surface 24 is connected to the inner conductor 15b. The columnar electrodes 21 and 22 are made of the same material as that of the inner conductors 15a and 15b (the metal material containing copper as a main component), and are formed integrally with the inner conductors 15a and 15b.

The ceramic portion 25 covers a side surface 23 of each of the columnar electrodes 21 and 22. A height of the ceramic portion 25 is the same as the height of the protruding portion 20. The ceramic portion 25 is made of the same material as that of the base material portion 14, and is formed integrally with the base material portion 14.

As illustrated in FIG. 2B, when the substrate 10 is viewed from the thickness direction (Z direction) (that is, when the high-frequency module 1 is viewed in plan), the protruding portion 20 has a frame shape, and has a rectangular outer shape. The substrate 10 has the substrate outer peripheral portion 11 positioned outside of the region in which the protruding portion 20 is provided, and a substrate inner peripheral portion 12 positioned inside of the region in which the protruding portion 20 is provided. As illustrated in FIG. 2A, the protruding portion 20 projects in the thickness direction, farther than the substrate outer peripheral portion 11 and the substrate inner peripheral portion 12.

In the present embodiment, the second electronic component 40 is mounted on the protruding portion 20, and the first electronic component 30 is mounted on a region on the main surface 10a of the substrate 10 different from the region in which the protruding portion 20 is provided, that is, on the substrate outer peripheral portion 11.

In this manner, by mounting the first electronic component 30 on the main surface 10a of the region different from the region in which the protruding portion 20 is provided, and mounting the second electronic component 40 on the protruding portion 20 positioned higher than the main surface 10a, the first electronic component 30 and the second electronic component 40 can be disposed so as to be separated from each other in the height direction. Whereby, the signal interference between the first electronic component 30 and the second electronic component 40 can be reduced, and the isolation can be improved.

In addition, in the present embodiment, as the columnar electrodes 21 and 22 of the protruding portion 20, the columnar electrodes 21 for signal input/output (13 electrodes) that are connected to the respective signal terminals 41 of the second electronic component 40, and the columnar electrodes 22 for grounding (3 electrodes) that are connected to the respective ground terminals 42 of the second electronic component 40 are included (see FIG. 2B). The columnar electrode 22 for grounding functions as an electromagnetic shield, and is provided near the signal terminal 31 of the first electronic component 30. Specifically, when the substrate 10 is viewed from the thickness direction, an interval i2 between the columnar electrode 22 for grounding and the signal terminal 31 (or the first bonding member 36) of the first electronic component 30 is smaller than an interval i1 between the column electrode 21 for signal input/output and the signal terminal 31 (or the first bonding member 36) of the first electronic component 30.

In this manner, by disposing the columnar electrode 22 for grounding near the signal terminal 31 of the first electronic component 30, and disposing the columnar electrode 21 for signal input/output away from the signal terminal 31 of the first electronic component 30, the columnar electrode 22 for grounding can be made to act as the shield for the signal terminal 31. Accordingly, the signal interference between the first electronic component 30 and the second electronic component 40 can be suppressed, and the isolation of the first electronic component 30 and the second electronic component 40 can be improved.

Further, in the present embodiment, the chip inductor 50 is provided so as to be adjacent to the protruding portion 20 in a region in the main surface 10a of the substrate 10 different from a region in which the protruding portion 20 and the first electronic component 30 are provided. Specifically, a side surface 52 of the chip inductor 50 is mounted in a state of being in contact with a side surface 20a of the protruding portion 20.

By providing the chip inductor 50 so as to be adjacent to the protruding portion 20 as described above, the high-frequency module 1 can be miniaturized. Further, since the side surface 52 of the chip inductor 50 abuts against the side surface 20a of the protruding portion 20, an attitude of the chip inductor 50 can be maintained such that a coil axis of the chip inductor 50 is directed in a direction perpendicular to the main surface 10a of the substrate 10. In this case, it is possible to suppress a magnetic field generated in the chip inductor 50 from affecting characteristics of the first electronic component 30 and the second electronic component 40.

[1-2. Method for Manufacturing High-Frequency Module]

Next, a method for manufacturing the high-frequency module 1 will be described.

First, each of a ceramic pattern containing a ceramic material and an inner conductor pattern containing a conductive material is formed with a predetermined pattern by a printing lamination method using screen printing or the like, and multiple layers of these patterns are recoated to form a laminated block serving as a base.

Next, in order to form the protruding portion 20, first printing and second printing illustrated below are alternately repeated to the laminated block. The first printing includes a step of forming an inner conductor pattern in a region corresponding to each of the columnar electrodes 21 and 22, a step of forming a ceramic pattern in a region corresponding to the ceramic portion 25, and a step of forming a resin pattern that does not contain a ceramic material in a region corresponding to each of the substrate outer peripheral portion 11 and the substrate inner peripheral portion 12. In addition, the second printing includes the step of forming the inner conductor pattern in the region corresponding to each of the columnar electrodes 21 and 22, and a step of forming a ceramic pattern in a region corresponding to each of the ceramic portion 25, the substrate outer peripheral portion 11, and the substrate inner peripheral portion 12.

Then, after each of the first printing and the second printing is performed a plurality of times, the laminated block is subjected to press-forming. By these printing and press forming, the laminated block is brought into a state in which only the inner conductor patterns are laminated in the regions corresponding to the respective columnar electrodes 21 and 22, is brought into a state in which only the ceramic patterns are laminated in the region corresponding to the ceramic portion 25, and is brought into a state in which the resin patterns and the ceramic patterns are alternately laminated in the regions corresponding to the respective substrate outer peripheral portion 11 and substrate inner peripheral portion 12.

Thereafter, the laminated block is baked. By this baking, the plurality of inner conductor patterns is sintered to form the columnar electrodes 21 and 22, and the plurality of ceramic patterns in the region in which only the ceramic patterns are laminated is sintered to form the ceramic portion 25. On the other hand, the substrate outer peripheral portion 11 and the substrate inner peripheral portion 12 are brought into a state in which the resin patterns are burned and disappear, and a plurality of thin layer ceramic sheets remains spaced apart from each other.

Thereafter, a blast treatment is applied to the laminated block. By this blast treatment, the plurality of thin film ceramic sheets remaining in the substrate outer peripheral portion 11 and the substrate inner peripheral portion 12 is removed. Thus, the protruding portion 20 formed of the columnar electrodes 21 and 22 and the ceramic portion 25 is formed on the laminated block. That is, the substrate 10 having the protruding portion 20 is formed.

Next, the first electronic component 30, the second electronic component 40, and the chip inductor 50 are mounted on the substrate 10 by using a mounting machine. A reflow treatment may be performed after the mounting as needed. Then, a resin is applied to the main surface 10a of the substrate 10 so as to cover the first electronic component 30, the second electronic component 40, and the chip inductor 50, thereby forming the sealing portion 13. By these steps, the high-frequency module 1 is manufactured.

[1-3. Effects and the Like]

The high-frequency module 1 according to the present embodiment includes the substrate 10, the first electronic component 30 and the second electronic component 40 mounted on the main surface 10a of the substrate 10. The substrate 10 includes the protruding portion 20 projecting from the main surface 10a, the first electronic component 30 is mounted in the region on the main surface 10a different from the region in which the protruding portion 20 is provided, and the second electronic component 40 is mounted on the protruding portion 20.

In this manner, by mounting the first electronic component 30 on the main surface 10a of the region different from the region in which the protruding portion 20 is provided, and mounting the second electronic component 40 on the protruding portion 20, the first electronic component 30 and the second electronic component 40 can be disposed so as to be separated from each other in the height direction (Z direction). Whereby, the signal interference between the first electronic component 30 and the second electronic component 40 can be reduced, and the isolation can be improved.

[1-4. Modification]

Figure 3:
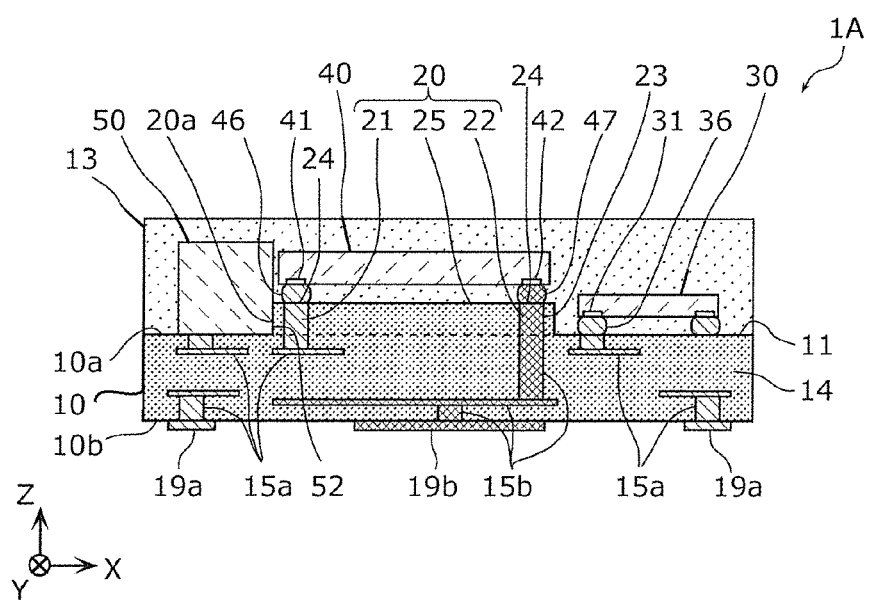
FIG. 3 is a cut front view of a high-frequency module according to a modification example of Embodiment 1.

FIG. 3 is a cut front view of a high-frequency module 1A according to a modification example of Embodiment 1.

In the high-frequency module 1A according to the present modification example, an inner side of the protruding portion 20 having a frame shape illustrated in Embodiment 1 is filled with a ceramic material. This portion filled with the ceramic material is made of the same material as that of the base material portion 14, and is formed integrally with the base material portion 14. In other words, in the protruding portion 20 of the present modification example, an entire area opposite to the bottom surface of the second electronic component 40 projects in the thickness direction farther than the substrate outer peripheral portion 11.

Also, in the high-frequency module 1A according to the present modification example, the first electronic component 30 and the second electronic component 40 can be disposed so as to be separated from each other in the height direction. Whereby, the signal interference between the first electronic component 30 and the second electronic component 40 can be reduced, and the isolation can be improved.

Embodiment 2

Figure 4A:
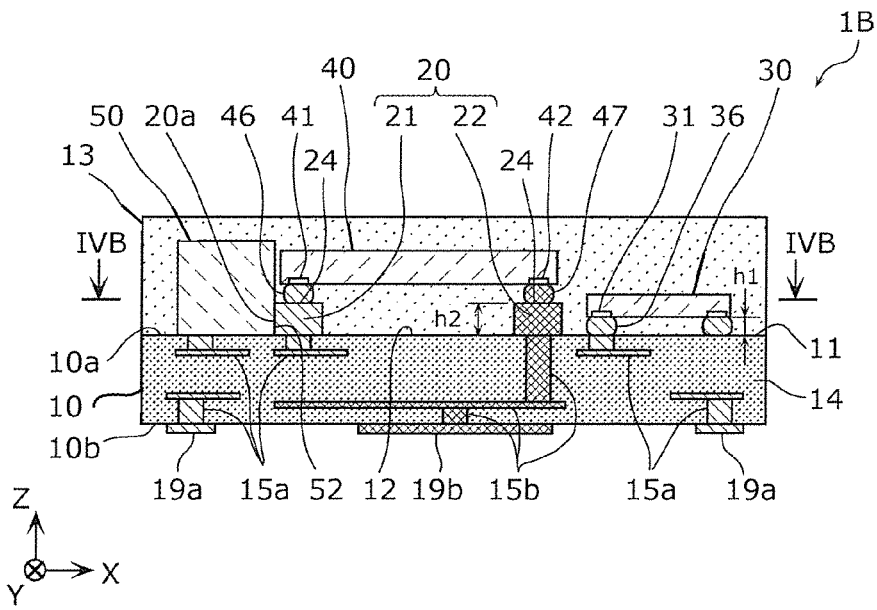
FIG. 4A is a cut front view of a high-frequency module according to Embodiment 2.
Figure 4B:
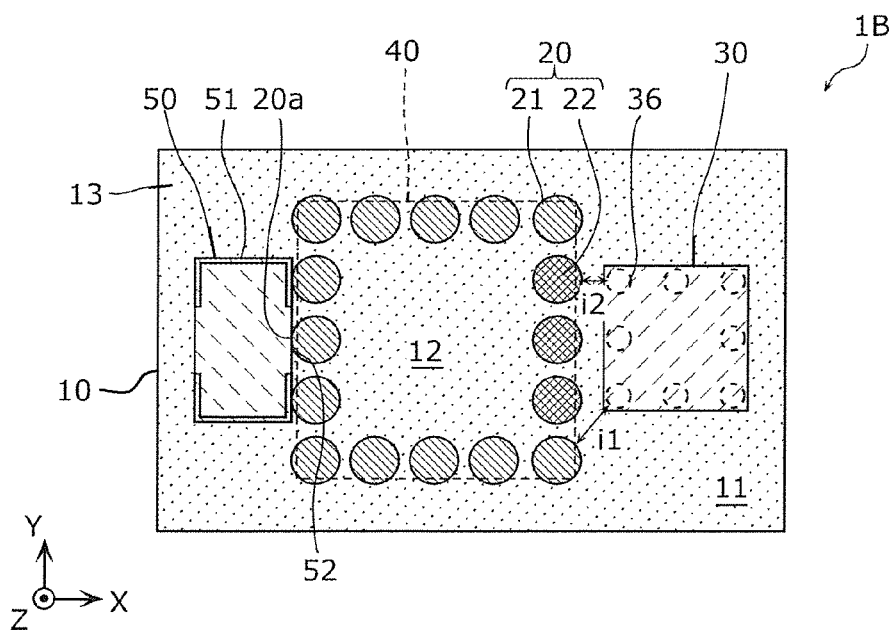
FIG. 4B is a cut plan view of the high-frequency module according to Embodiment 2, cut along a line IVB-IVB illustrated in FIG. 4A.

FIG. 4A is a cut front view of a high-frequency module 1B according to Embodiment 2. FIG. 4B is a cut plan view of the high-frequency module 1B, cut along a line IVB-IVB illustrated in FIG. 4A.

In the high-frequency module 1B according to Embodiment 2, the protruding portion 20 projecting from the main surface 10a of the substrate 10 is composed of the plurality of columnar electrodes 21 and 22.

Specifically, the protruding portion 20 does not include the ceramic portion 25, and is formed only of the plurality of columnar electrodes 21 and 22. Each of the columnar electrodes 21 and 22 has, for example, a cylindrical shape. However, each of the columnar electrodes 21 and 22 may have a prismatic shape. The height h2 of the protruding portion 20 formed of the columnar electrodes 21 and 22 is higher than the height h1 of the first bonding member 36, and is, for example, 50 μm or more and 200 μm or less.

Of both the end surfaces of the columnar electrode 21, the one end surface 24 positioned at the upper end is connected to the signal terminal 41 of the second electronic component 40 with the second bonding member 46 interposed therebetween, and the end surface opposite to the one end surface 24 is connected to the inner conductor 15a. Of both the end surfaces of the columnar electrode 22, the one end surface 24 positioned at the upper end is connected to the ground terminal 42 of the second electronic component 40 with the second bonding member 47 interposed therebetween, and the end surface opposite to the one end surface 24 is connected to the inner conductor 15b. The columnar electrodes 21 and 22 are made of the same material as that of the inner conductors 15a and 15b (the metal material containing copper as a main component), and are formed integrally with the inner conductors 15a and 15b.

In the high-frequency module 1B of the present embodiment, the second electronic component 40 is mounted on the protruding portion 20 (columnar electrodes 21 and 22), and the first electronic component 30 is mounted on the region on the main surface 10a different from the region in which the protruding portion 20 is provided.

In this manner, by mounting the first electronic component 30 on the main surface 10a of the region different from the region in which the protruding portion 20 is provided, and mounting the second electronic component 40 on the protruding portion 20, the first electronic component 30 and the second electronic component 40 can be disposed so as to be separated from each other in the height direction. Whereby, the signal interference between the first electronic component 30 and the second electronic component 40 can be reduced, and the isolation can be improved.

Additionally, in the present embodiment, when the substrate 10 is viewed from the thickness direction, the interval i2 between the columnar electrode 22 for grounding and the signal terminal 31 (or the first bonding member 36) of the first electronic component 30 is smaller than the interval i1 between the column electrode 21 for signal input/output and the signal terminal 31 (or the first bonding member 36) of the first electronic component 30.

In this manner, by disposing the columnar electrode 22 for grounding near the signal terminal 31 of the first electronic component 30, and disposing the columnar electrode 21 for signal input/output away from the signal terminal 31 of the first electronic component 30, the columnar electrode 22 for grounding can be made to act as the shield for the signal terminal 31. Accordingly, the signal interference between the first electronic component 30 and the second electronic component 40 can be suppressed, and the isolation can be improved.

Embodiment 3

Configurations of the respective above-described high-frequency modules 1, 1A, and 1B can be applied to a high-frequency module supporting a plurality of communication bands (bands), that is, a high-frequency module supporting multiband. In Embodiment 3, an example of such a multiband supporting high-frequency module will be described.

First, a circuit configuration of a high-frequency module 1C according to Embodiment 3 will be described.

Figure 5:
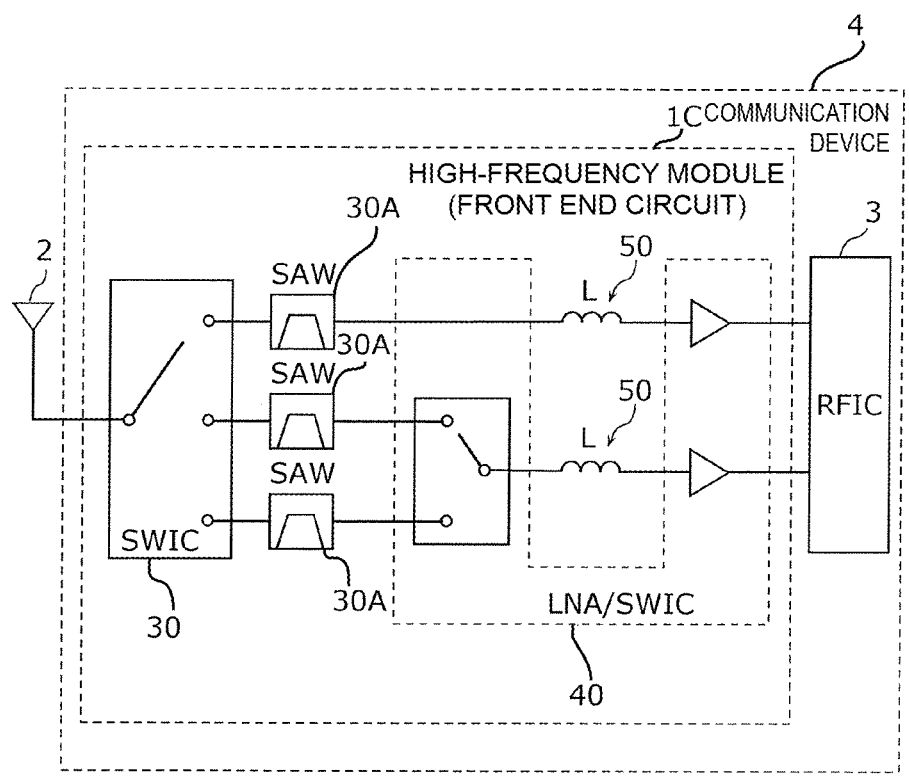
FIG. 5 is a diagram illustrating a circuit configuration of a high-frequency module according to Embodiment 3.

FIG. 5 is a diagram illustrating a circuit configuration of the high-frequency module 1C. Note that, in the figure, in addition to the high-frequency module 1C, an antenna element 2 and an RF signal processing circuit (RFIC) 3 are illustrated. In addition, the figure illustrates a communication device 4 composed of the high-frequency module 1C and the RFIC 3.

The high-frequency module 1C is a circuit for transmitting a high-frequency signal between the antenna element 2 and the RFIC 3. The high-frequency module 1C transmits a high-frequency signal outputted from the RFIC 3 to the antenna element 2 with a transmission-side signal path (not illustrated) interposed therebetween, and transmits a high-frequency signal received by the antenna element 2 to the RFIC 3 with a reception-side signal path interposed therebetween.

The high-frequency module 1C includes a switch IC (SWIC), three SAW filters, a low noise amplifier/switch IC (LNA/SWIC), and two inductors L. In the present embodiment, the SWIC corresponds to the first electronic component 30, the SAW filter corresponds to a first electronic component 30A, the LNA/SWIC corresponds to the second electronic component 40, and the inductor L corresponds to the chip inductor 50. Note that, in FIG. 5, when the inductor 50 is disposed in front of the LNA (on an input side), the chip inductor 50 is increased in size because the quality factor Q is emphasized. As the chip inductor 50 according to the present embodiment, an inductor having the high quality factor Q and a high outer shape is adopted.

Figure 6A:
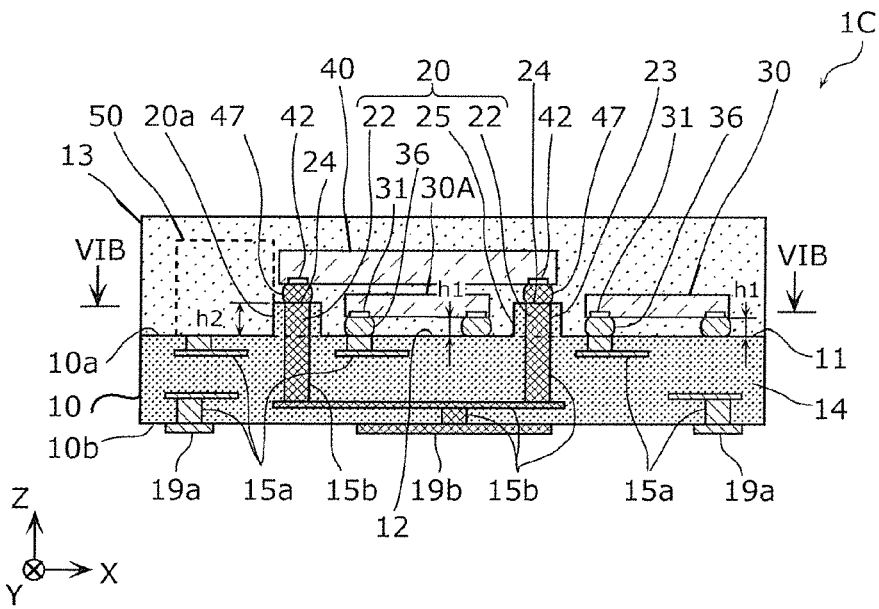
FIG. 6A is a cut front view of the high-frequency module according to Embodiment 3.
Figure 6B:
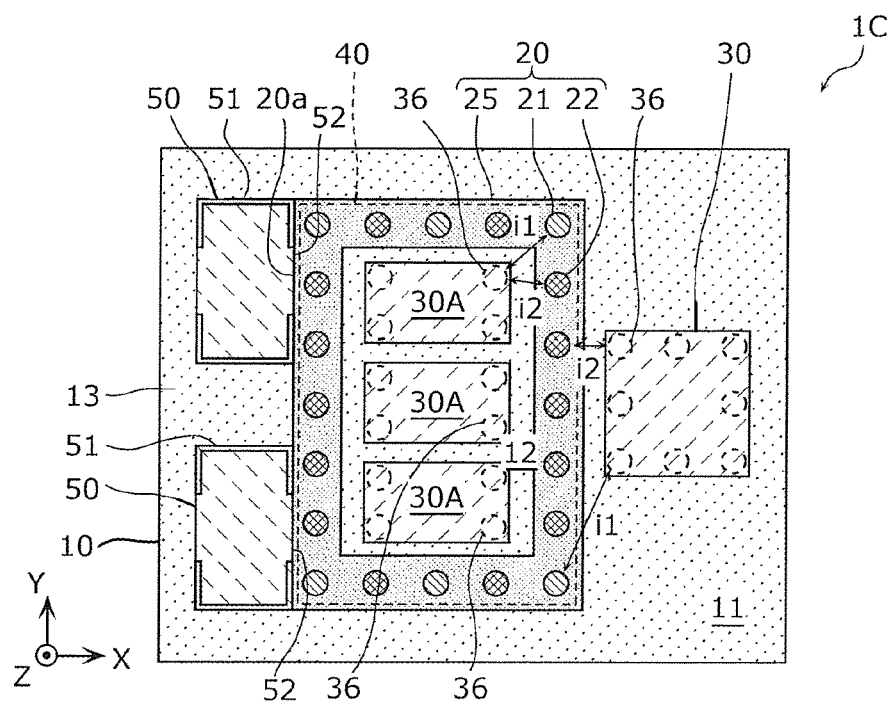
FIG. 6B is a cut plan view of the high-frequency module according to Embodiment 3, cut along a line VIB-VIB illustrated in FIG. 6A.

Next, the structure of the high-frequency module 1C having the above-described circuit configuration will be described. FIG. 6A is a cut front view of the high-frequency module 1C. FIG. 6B is a cut plan view of the high-frequency module 1C, cut along the line VIB-VIB illustrated in FIG. 6A.

As illustrated in FIGS. 6A and 6B, the high-frequency module 1C includes the substrate 10, the first electronic component 30 mounted on the substrate 10, three of the first electronic components 30A, the second electronic component 40, and two of the chip inductors 50. In the high-frequency module 1C, the second electronic component 40 is disposed at a position higher than that of the first electronic component 30A so as to cover the first electronic component 30A. That is, the high-frequency module 1C has hierarchical structure in which the second electronic component 40 is provided over the first electronic component 30A. In addition, the sealing portion 13 is provided on the substrate 10 so as to cover the first electronic components 30 and 30A, the second electronic component 40, and the chip inductors 50.

The first electronic component 30 is, for example, a semiconductor circuit device including a switching element. The first electronic component 30 is inputted with and outputs a high-frequency signal in an arbitrary frequency band of, for example, 500 MHz or more and 1500 MHz or less, within a frequency band of 500 MHz or more and 6 GHz or less. The first electronic component 30 has a rectangular parallelepiped shape, and the plurality of signal terminals (hot terminals) 31 drawn out from the input/output wiring of the switching element is provided on a bottom surface of the first electronic component 30. The first electronic component 30 is connected to the substrate 10 by the plurality of first bonding members 36 for signal input/output corresponding to the respective signal terminals 31. The first bonding member 36 is, for example, a solder bump. A height of the first bonding member 36 is, for example, 40 μm.

The first electronic component 30A is an acoustic wave device including an acoustic wave element used in an arbitrary frequency band, for example, in a frequency band of 500 MHz or more and 1500 MHz or less, within a frequency band of 500 MHz or more and 6 GHz or less. The first electronic component 30A has a rectangular parallelepiped shape, and the plurality of signal terminals (hot terminals) 31 drawn out from the input/output wiring of the acoustic wave element is provided on a bottom surface of the first electronic component 30A. The first electronic component 30A is connected to the substrate 10 by the plurality of first bonding members 36 corresponding to the respective signal terminals 31. The first bonding member 36 is, for example, a solder bump. The height h1 of the first bonding member 36 is, for example, 40 μm.

The second electronic component 40 is, for example, a semiconductor circuit device including a semiconductor element such as a switching element or an amplifier circuit element. The second electronic component 40 is inputted with and outputs a high-frequency signal in an arbitrary frequency band of, for example, 500 MHz or more and 1500 MHz or less, within a frequency band of 500 MHz or more and 6 GHz or less. The second electronic component 40 has a rectangular parallelepiped shape, and the plurality of signal terminals (hot terminals) 41 drawn out from the input/output wiring of a semiconductor element and the plurality of ground terminals 42 are provided on a bottom surface of the second electronic component 40. The second electronic component 40 is connected to the substrate 10 by the plurality of the second bonding members 46 for signal input/output corresponding to the respective signal terminals 41, and the plurality of second bonding members 47 for grounding corresponding to the respective ground terminals 42. Each of the second bonding members 46 and 47 is, for example, a solder bump. A height of the second bonding members 46 and 47 is, for example, 40 μm.

The first electronic component 30 and the second electronic component 40 are mounted in a state of being close to each other in a direction (for example, in the X direction) along the main surface 10a of the substrate 10. The first electronic component 30A and the second electronic component 40 are mounted in a state of being close to each other in a thickness direction of the substrate 10. Note that, the state of being close refers to, for example, a state in which a distance between the first electronic component 30 or 30A, and the second electronic component 40 is more than 0 μm and less than or equal to 300 μm.

The chip inductor 50 is a multilayer inductor manufactured by a method including, for example, a sheet lamination method, a printing lamination method, or a thin film formation method. The chip inductor 50 has a rectangular parallelepiped outer shape, and the pair of outer electrodes 51 is formed at both ends or at a bottom surface thereof. The chip inductor 50 is connected to the substrate 10 by a solder material or the like. As the chip inductor 50 according to the present embodiment, an inductor having the high quality coefficient Q and a high outer shape (higher than respective outer shapes of the first electronic components 30 and 30A, and the second electronic component 40) is adopted.

The protruding portion 20 projecting from the main surface 10a is formed on the main surface 10a of the substrate 10. The height h2 of the protruding portion 20 is higher than the height h1 of the first bonding member 36. Specifically, the height of the protruding portion 20 is, for example, 50 μm or more and 200 μm or less. In addition, in the height direction (Z direction), a position of an upper end of the protruding portion 20 is higher than a position of a bottom surface of each of the first electronic components 30 and 30A, and is lower than a position of a top surface of each of the first electronic components 30 and 30A. Here, the "height direction" means the same direction as a thickness direction of the substrate 10, and the "high" means that a distance from a region (the substrate outer peripheral portion 11, which will be described later) different from a region in the main surface 10a of the substrate 10 in which the protruding portion 20 is provided is large.

The protruding portion 20 includes the plurality of columnar electrodes 21 and 22, and the ceramic portion 25.

The columnar electrodes 21 and 22 have a cylindrical shape with a diameter of 500 µm, for example. However, the columnar electrodes 21 and 22 may have a prismatic shape. A height of the columnar electrodes 21 and 22 is the same as the height h2 of the protruding portion 20. Of both end surfaces of the columnar electrode 21, the one end surface 24 exposed to the upper end of the protruding portion 20 is connected to the signal terminal 41 of the second electronic component 40 with the second bonding member 46 interposed therebetween, and an end surface opposite to the one end surface 24 is connected to the inner conductor 15a. Of both end surfaces of the columnar electrode 22, the one end surface 24 exposed to the upper end of the protruding portion 20 is connected to the ground terminal 42 of the second electronic component 40 with the second bonding member 47 interposed therebetween, and the end surface opposite to the one end surface 24 is connected to the inner conductor 15b. The columnar electrodes 21 and 22 are made of the same material as that of the inner conductors 15a and 15b (the metal material containing copper as a main component), and are formed integrally with the inner conductors 15a and 15b.

The ceramic portion 25 covers the side surface 23 of each of the columnar electrodes 21 and 22. A height of the ceramic portion 25 is the same as the height of the protruding portion 20. The ceramic portion 25 is made of the same material as that of the base material portion 14, and is formed integrally with the base material portion 14.

As illustrated in FIG. 6B, when the substrate 10 is viewed from the thickness direction (Z direction), the protruding portion 20 has a frame shape, and has a rectangular outer shape. The substrate 10 has the substrate outer peripheral portion 11 positioned outside of the region in which the protruding portion 20 is provided, and the substrate inner peripheral portion 12 positioned inside of the region in which the protruding portion 20 is provided. As illustrated in FIG. 6A, the protruding portion 20 projects in the thickness direction, farther than the substrate outer peripheral portion 11 and the substrate inner peripheral portion 12.

In the present embodiment, each of the first electronic components 30 and 30A is mounted in a region on the main surface 10a of the substrate 10 different from the region in which the protruding portion 20 is provided. Specifically, the first electronic component 30 is mounted on the substrate outer peripheral portion 11, and the three first electronic components 30A are mounted on the substrate inner peripheral portion 12. The second electronic component 40 is mounted on the protruding portion 20 so as to cover the three first electronic components 30A.

In this manner, by mounting each of the first electronic components 30 and 30A on the main surface 10a of the region different from the region in which the protruding portion 20 is provided, and mounting the second electronic component 40 on the protruding portion 20, the first electronic components 30 and 30A and the second electronic component 40 can be disposed so as to be separated from each other in the height direction. Whereby, the signal interference among the first electronic components 30 and 30A and the second electronic component 40 can be reduced, and the isolation can be improved.

In addition, in the present embodiment, as the columnar electrodes 21 and 22 of the protruding portion 20, the columnar electrodes 21 for signal input/output (6 electrodes) that are connected to the respective signal terminals 41 of the second electronic component 40, and the columnar electrodes 22 for grounding (14 electrodes) that are connected to the respective ground terminals 42 of the second electronic component 40 are included (see FIG. 6B). The columnar electrode 22 for grounding functions as an electromagnetic shield, and is provided near the signal terminal 31 of each of the first electronic components 30 and 30A. Specifically, when the substrate 10 is viewed from the thickness direction, the interval i2 between the columnar electrode 22 for grounding and the signal terminal 31 (or the first bonding member 36) of each of the first electronic components 30 and 30A is smaller than the interval i1 between the column electrode 21 for signal input/output and the signal terminal 31 (or the first bonding member 36) of each of the first electronic components 30 and 30A.

In this manner, by disposing the columnar electrode 22 for grounding near the signal terminal 31 of each of the first electronic components 30 and 30A, and disposing the columnar electrode 21 for signal input/output away from the signal terminal 31 of each of the first electronic components 30 and 30A, the columnar electrode 22 for grounding can be made to act as a shield for the signal terminal 31. Accordingly, the signal interference among the first electronic components 30 and 30A and the second electronic component 40 can be suppressed, and the isolation of the first electronic components 30 and 30A and the second electronic component 40 can be improved.

Further, in the present embodiment, the chip inductor 50 is provided so as to be adjacent to the protruding portion 20 in a region in the main surface 10a of the substrate 10 different from a region in which the protruding portion 20 and the first electronic components 30 and 30A are provided. Specifically, the side surface 52 of the chip inductor 50 is mounted in a state of being in contact with the side surface 20a of the protruding portion 20.

By providing the chip inductor 50 so as to be adjacent to the protruding portion 20 as described above, the high-frequency module 1c can be miniaturized. Further, since the side surface 52 of the chip inductor 50 abuts against the side surface 20a of the protruding portion 20, an attitude of the chip inductor 50 can be maintained such that a coil axis of the chip inductor 50 is directed in a direction perpendicular to the main surface 10a of the substrate 10. In this case, it is possible to suppress a magnetic field generated in the chip inductor 50 from affecting characteristics of the first electronic components 30 and 30A and the second electronic component 40.

Embodiment 4

Figure 7A:
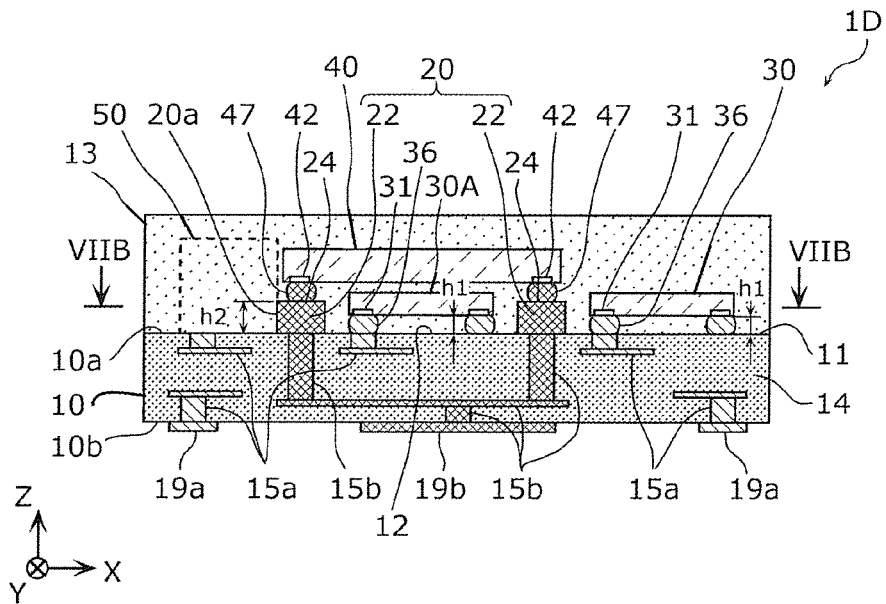
FIG. 7A is a cut front view of a high-frequency module according to Embodiment 4.
Figure 7B:
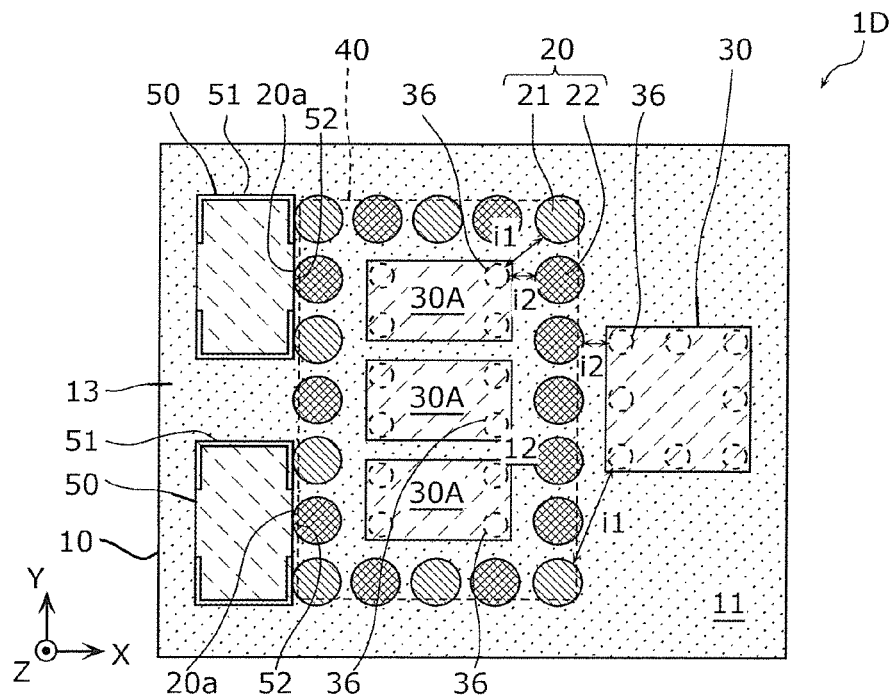
FIG. 7B is a cut plan view of the high-frequency module according to Embodiment 4, cut along a line VIIB-VIIB illustrated in FIG. 7A.

FIG. 7A is a cut front view of a high-frequency module 1D according to Embodiment 4. FIG. 7B is a cut plan view of the high-frequency module 1D, cut along a line VIIB-VIIB illustrated in FIG. 7A.

In the high-frequency module 1D of Embodiment 4, the protruding portion 20 in the high-frequency module 1C of Embodiment 3 is formed of the plurality of columnar electrodes 21 and 22 as illustrated in Embodiment 2.

Specifically, the protruding portion 20 does not include the ceramic portion 25, and is formed only of the plurality of columnar electrodes 21 and 22. Each of the columnar electrodes 21 and 22 has, for example, a cylindrical shape. However, each of the columnar electrodes 21 and 22 may have a prismatic shape. The height h2 of the protruding portion 20 formed of the columnar electrodes 21 and 22 is higher than the height h1 of the first bonding member 36, and is, for example, 50 µm or more and 200 µm or less.

In the present embodiment, each of the first electronic components 30 and 30A is mounted in a region on the main surface 10a of the substrate 10 different from the region in which the protruding portion 20 is provided. Specifically, the first electronic component 30 is mounted on the substrate outer peripheral portion 11, and the three first electronic components 30A are mounted on the substrate inner peripheral portion 12. The second electronic component 40 is mounted on the protruding portion 20 (columnar electrodes 21 and 22) so as to cover the three first electronic components 30A.

In this manner, by mounting each of the first electronic components 30 and 30A on the main surface 10a of the region different from the region in which the protruding portion 20 is provided, and mounting the second electronic component 40 on the protruding portion 20, the first electronic components 30 and 30A and the second electronic component 40 can be disposed so as to be separated from each other in the height direction (thickness direction). Whereby, the signal interference among the first electronic components 30 and 30A and the second electronic component 40 can be reduced, and the isolation can be improved.

In addition, in the present embodiment, in the columnar electrodes 21 and 22, the columnar electrodes 21 for signal input/output (8 electrodes) that are connected to the respective signal terminals 41 of the second electronic component 40, and the columnar electrodes 22 for grounding (12 electrodes) that are connected to the respective ground terminals 42 of the second electronic component 40 are included (see FIG. 7B). Additionally, when the substrate 10 is viewed from the thickness direction, the interval i2 between the columnar electrode 22 for grounding and the signal terminal 31 (or the first bonding member 36) of each of the first electronic components 30 and 30A is smaller than the interval i1 between the column electrode 21 for signal input/output and the signal terminal 31 (or the first bonding member 36) of each of the first electronic components 30 and 30A.

In this manner, by disposing the columnar electrode 22 for grounding near the signal terminal 31 of each of the first electronic components 30 and 30A, and disposing the columnar electrode 21 for signal input/output away from the signal terminal 31 of each of the first electronic components 30 and 30A, the columnar electrode 22 for grounding can be made to act as a shield for the signal terminal 31. Accordingly, the signal interference among the first electronic components 30 and 30A and the second electronic component 40 can be suppressed, and the isolation can be improved.

Further, in the present embodiment, the chip inductor 50 is provided so as to be adjacent to the protruding portion 20 in a region in the main surface 10a of the substrate 10 different from a region in which the protruding portion 20 and the first electronic components 30 and 30A are provided. Specifically, the side surface 52 of the chip inductor 50 is mounted in a state of being in contact with the side surface 20a of the protruding portion 20.

By providing the chip inductor 50 so as to be adjacent to the protruding portion 20 as described above, the high-frequency module 1D can be miniaturized. Further, since the side surface 52 of the chip inductor 50 abuts against the side surface 20a of the protruding portion 20, an attitude of the chip inductor 50 can be maintained such that a coil axis of the chip inductor 50 is directed in a direction perpendicular to the main surface 10a of the substrate 10. In this case, it is possible to suppress a magnetic field generated in the chip inductor 50 from affecting characteristics of the first electronic components 30 and 30A and the second electronic component 40.

Further, as illustrated in FIG. 7B, when the outer electrode 51 of the chip inductor 50 is connected to the columnar electrode 21 for signal input/output by using solder or the like, a wiring path between the chip inductor 50 and the second electronic component 40 can be shortened, and power loss in the high-frequency module 1D can be reduced.

Embodiment 5

Figure 8:
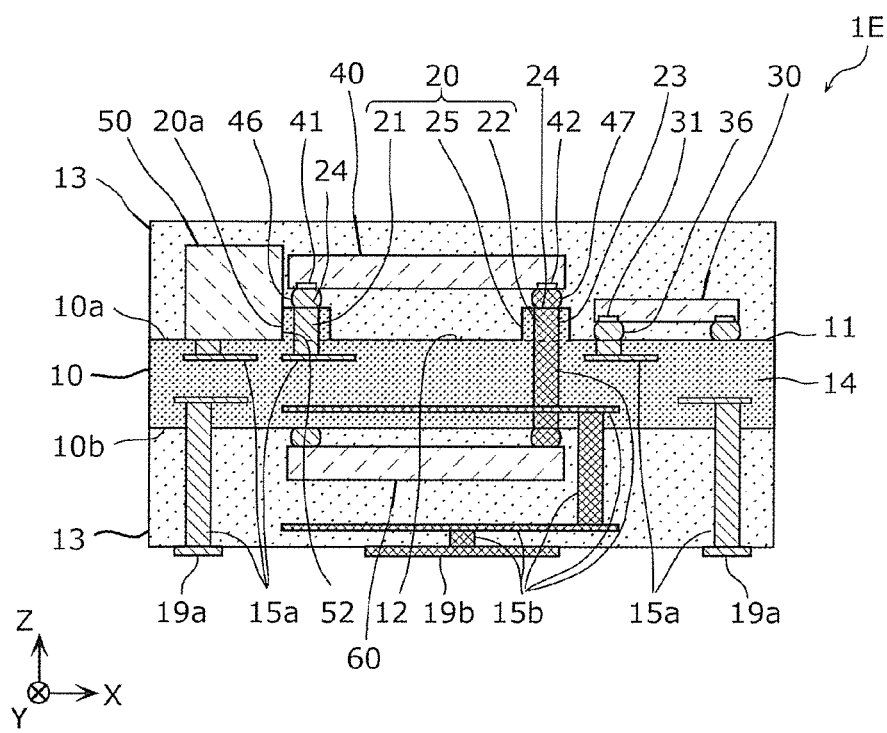
FIG. 8 is a cut front view of a high-frequency module according to Embodiment 5.

FIG. 8 is a cut front view of a high-frequency module 1E according to Embodiment 5.

The high-frequency module 1E has a structure in which individual electronic components are mounted on both sides of a substrate.

Specifically, the first electronic component 30, the second electronic component 40, and the chip inductor 50 are mounted on the one main surface 10a of the substrate 10 in the same manner as in Embodiment 1, and further, a third electronic component 60 is mounted on the other main surface 10b of the substrate 10. The third electronic component 60 is, for example, a semiconductor circuit device. Additionally, the sealing portion 13 is formed on the other main surface 10b of the substrate 10 so as to cover the third electronic component 60. Note that, in the present embodiment, a protruding portion may be provided on the other main surface 10b, and an electronic component different from the third electronic component 60 may be mounted on the protruding portion on the other main surface 10b.

Also in the high-frequency module 1E, the first electronic component 30 and the second electronic component 40 can be disposed so as to be separated from each other in the height direction. Whereby, the signal interference between the first electronic component 30 and the second electronic component 40 can be reduced, and the isolation can be improved.

Other Embodiments

Although the high-frequency modules according to Embodiments 1 to 5 and the modification example of the present disclosure have been described above, the present disclosure is not limited to individual Embodiments 1 to 5 and the modification example. Those that are obtained by applying various modifications that those skilled in the art can think of to Embodiments 1 to 5 and the modification example without departing from the spirit of the present disclosure, as well as modes that are constructed by combining constituent elements in the different embodiments may also be included within the scope of one or more aspects of the present disclosure.

For example, in Embodiment 1, the example in which the first electronic component 30 is the acoustic wave device and the second electronic component 40 is a semiconductor circuit device is illustrated, however, the present disclosure is not limited thereto, and the second electronic component 40 may be an acoustic wave device, and the first electronic component 30 may be a semiconductor circuit device. Additionally, both the first electronic component 30 and the second electronic component 40 may be acoustic wave devices, or may be semiconductor circuit devices.

For example, the first bonding member 36, the second bonding members 46 and 47 are not limited to the solder bumps, and may be conductive adhesives.

For example, the chip inductor 50 is not limited to the multilayer inductor, and may be a winding inductor. Further, the chip inductor 50 may be a composite component containing an inductor element and other passive elements.

For example, the shape of the protruding portion 20 is not limited to the frame shape when viewed from the thickness direction of the substrate 10, and a ceramic portion may be provided in an island shape so as to cover each of the columnar electrodes 21 and 22 individually.

For example, in a method for manufacturing a high-frequency module, a laminated block may be formed not only by a printing lamination method, but also by a sheet lamination method.

The high-frequency modules according to the present disclosure can be widely used as a component of an electronic device such as a personal digital assistant.

1, 1A, 1B, 1C, 1D, 1E HIGH-FREQUENCY MODULE
2 ANTENNA ELEMENT
3 RFIC
4 COMMUNICATION DEVICE
10 SUBSTRATE
10a ONE MAIN SURFACE
10b ANOTHER MAIN SURFACE
11 SUBSTRATE OUTER PERIPHERAL PORTION
12 SUBSTRATE INNER PERIPHERAL PORTION
13 SEALING PORTION
14 BASE MATERIAL PORTION
15a, 15b INNER CONDUCTOR
19a, 19b OUTER TERMINAL
20 PROTRUDING PORTION
20a SIDE SURFACE OF PROTRUDING PORTION
21 COLUMNAR ELECTRODE FOR SIGNAL INPUT/OUTPUT
22 COLUMNAR ELECTRODE FOR GROUNDING
23 SIDE SURFACE OF COLUMNAR ELECTRODE
24 END SURFACE OF COLUMNAR ELECTRODE
25 CERAMIC PORTION
30, 30A FIRST ELECTRONIC COMPONENTS
31 SIGNAL TERMINAL
36 FIRST BONDING MEMBER
40 SECOND ELECTRONIC COMPONENT
41 SIGNAL TERMINAL
42 GROUND TERMINAL
46 SECOND BONDING MEMBER FOR SIGNAL INPUT/OUTPUT
47 SECOND BONDING MEMBER FOR GROUNDING
50 CHIP INDUCTOR
51 OUTER ELECTRODE
52 SIDE SURFACE OF CHIP INDUCTOR
60 THIRD ELECTRONIC COMPONENT
h1 HEIGHT OF PROTRUDING PORTION
h2 HEIGHT OF FIRST BONDING MEMBER
i1, i2 INTERVAL

The invention claimed is:

1. A high-frequency module, comprising:
a substrate, and
a first electronic component and a second electronic component mounted on a main surface of the substrate,
wherein the substrate includes a protruding portion projecting from the main surface,
the first electronic component is mounted on a region of the main surface different from a region in which the protruding portion is provided, and
the second electronic component is mounted on the protruding portion,
wherein the protrusion portion includes a plurality of columnar electrodes,
wherein the plurality of columnar electrodes includes a columnar electrode for signal input/output connected to a signal terminal of the second electronic component, and a columnar electrode for grounding connected to a ground terminal of the second electronic component, and
when viewed from a thickness direction with respect to the substrate, an interval between the columnar electrode for grounding and a signal terminal of the first electronic component is smaller than an interval between the columnar electrode for signal input/output and the signal terminal of the first electronic component.

2. The high-frequency module according to claim 1,
wherein the first electronic component is connected to the substrate by a first bonding member, and
a height of the protruding portion is higher than a height of the first bonding member.

3. The high-frequency module according to claim 1,
wherein a ceramic portion covering side surfaces of the respective columnar electrodes, and
the second electronic component is connected to an end surface of each of the columnar electrodes by a second bonding member.

4. The high-frequency module according to claim 3,
wherein the substrate includes a substrate outer peripheral portion positioned outside of the region in which the protruding portion is provided, and
wherein the protruding portion has a rectangular outer shape when the substrate is viewed from a thickness direction of the substrate, and projects in the thickness direction farther than the substrate outer peripheral portion.

5. The high-frequency module according to claim 1,
wherein the protruding portion consists of a plurality of columnar electrodes, and
the second electronic component is connected to an end surface of each of the columnar electrodes by a second bonding member.

6. The high-frequency module according to claim 3,
wherein each of the plurality of columnar electrodes is provided around the first electronic component, and
the second electronic component is disposed at a position higher than a position of the first electronic component so as to cover the first electronic component.

7. The high-frequency module according to claim 3,
wherein each of the columnar electrodes contains a copper material.

8. The high-frequency module according to claim 1,
wherein the first electronic component is an acoustic wave device, and the second electronic component is a semiconductor circuit device.

9. The high-frequency module according to claim 1, further comprising:
a chip inductor mounted on the substrate,
wherein the chip inductor is disposed so as to be adjacent to the protruding portion in a region of the main surface different from a region in which the protruding portion and the first electronic component are provided.

10. The high-frequency module according to claim 1, further comprising:
a third electronic component mounted on another main surface of the substrate opposite to the main surface.

11. The high-frequency module according to claim 2,
wherein a ceramic portion covering side surfaces of the respective columnar electrodes, and
the second electronic component is connected to an end surface of each of the columnar electrodes by a second bonding member.

12. The high-frequency module according to claim 2,
wherein the protruding portion consists of a plurality of columnar electrodes, and
the second electronic component is connected to an end surface of each of the columnar electrodes by a second bonding member.

13. The high-frequency module according to claim 4,
wherein each of the plurality of columnar electrodes is provided around the first electronic component, and
the second electronic component is disposed at a position higher than a position of the first electronic component so as to cover the first electronic component.

14. The high-frequency module according to claim 5,
wherein each of the plurality of columnar electrodes is provided around the first electronic component, and
the second electronic component is disposed at a position higher than a position of the first electronic component so as to cover the first electronic component.

15. The high-frequency module according to claim 4,
wherein each of the columnar electrodes contains a copper material.

16. The high-frequency module according to claim 5,
wherein each of the columnar electrodes contains a copper material.

* * * * *